United States Patent [19]

Garbis et al.

[11] Patent Number: 4,522,149

[45] Date of Patent: Jun. 11, 1985

[54] REACTOR AND SUSCEPTOR FOR CHEMICAL VAPOR DEPOSITION PROCESS

[75] Inventors: Dennis Garbis, Dix Hills; Joseph Y. Chan, Kings Park; Amedeo J. Granata, Flushing; Robert C. Heller, Stony Brook, all of N.Y.

[73] Assignee: General Instrument Corp., Clifton, N.J.

[21] Appl. No.: 553,962

[22] Filed: Nov. 21, 1983

[51] Int. Cl.³ ............................................. C23C 13/08
[52] U.S. Cl. .................................. 118/725; 118/728; 118/500; 219/10.49 R; 219/10.67
[58] Field of Search ............... 118/728, 725, 500, 729, 118/730; 219/10.49 R, 10.67, 10.57, 10.49 A

[56] References Cited

U.S. PATENT DOCUMENTS

| | | | |
|---|---|---|---|
| 3,594,242 | 7/1971 | Burd et al. | 118/500 X |
| 4,322,592 | 3/1982 | Martin | 118/500 X |
| 4,352,713 | 10/1982 | Morita | 427/94 X |

FOREIGN PATENT DOCUMENTS 110030 8/1980 Japan .................................. 118/728

OTHER PUBLICATIONS

Pogge et al., "High-Capacity Narrow Susceptor for Vapor Growth Processes", IBM Tech. Disclosure Bulletin, vol. 13, No. 3, Aug. 1970, pp. 804–805.
Castrucci et al., "High Capacity Susceptor", IBM Tech. Disclosure Bulletin, vol. 13, No. 3, Aug. 1970, p. 753.

Primary Examiner—John D. Smith
Assistant Examiner—Bernard F. Plantz
Attorney, Agent, or Firm—James & Franklin

[57] ABSTRACT

A reactor for use in a chemical vapor deposition process occurring in a radiant absorption heater system employs a vertical gas flow reaction vessel and a novel substantially solid susceptor configured as a truncated wedge. The susceptor is characterized by a high utilized area, resulting in a high wafer capacity and low power requirement.

15 Claims, 9 Drawing Figures

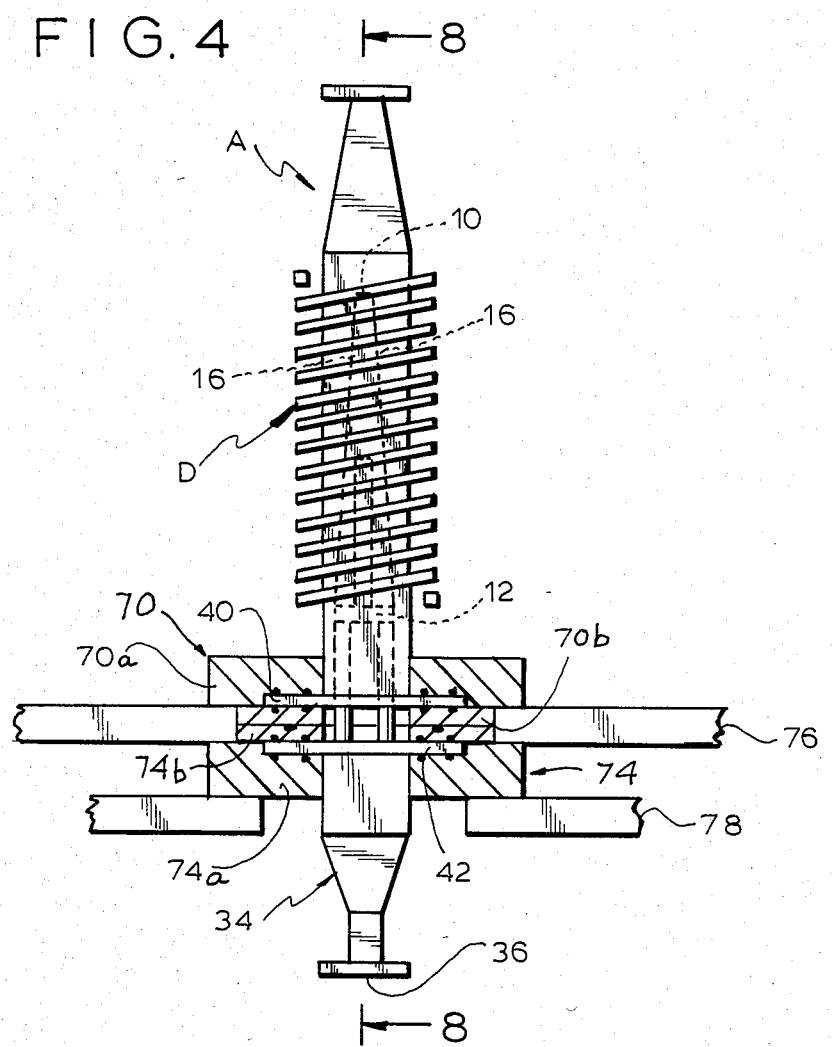
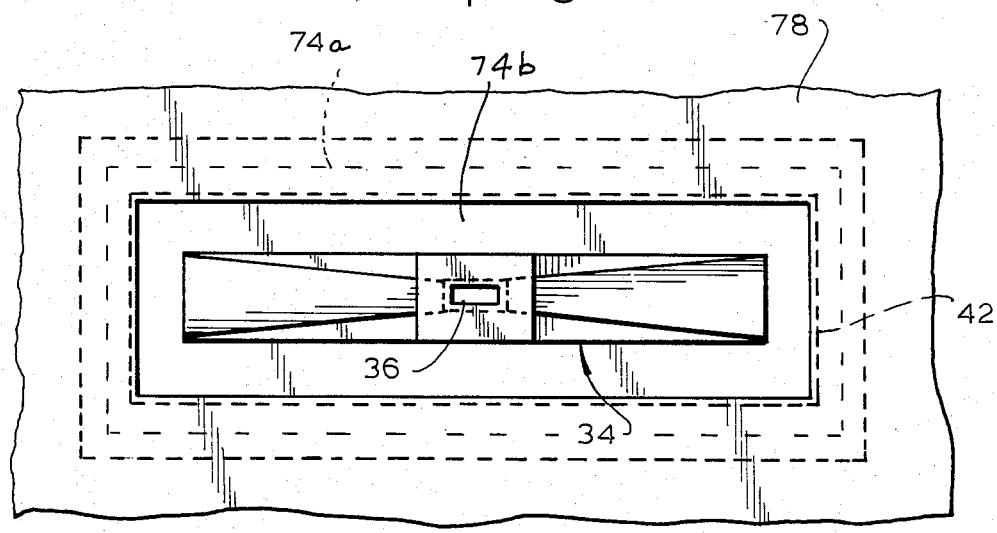

REACTOR AND SUSCEPTOR FOR CHEMICAL VAPOR DEPOSITION PROCESS

BACKGROUND OF THE INVENTION

The present invention relates to reactors and susceptors, and more particularly to reactors and susceptors useful in a chemical vapor deposition process occurring in a radiant absorption heater system.

Chemical vapor deposition processes are currently used to produce a variety of high purity materials and are of special utility in the production of III-V materials (such as gallium arsenide) and other epitaxial compositions used for semiconductors, ect.

The chemical vapor deposition process is typically performed in any of a variety of reactors well recognized in the art, including horizontal reactors, vertical reactors, pancake reactors, and the like. Broadly, the reactors fall into two different classifications: radiant absorption heater systems (such as cold wall reactors) and oven reactors (such as hot wall reactors). Cold wall or radiant energy absorption systems are typically preferred over hot wall reactors for many reasons including their better yields and throughputs.

In the oven reactor, all of the equipment associated with the process is heated more-or-less to the reaction temperature of the source gases, which then deposit the material to be formed not only on the intended substrate, but also, for example, on the walls of the reactor vessel, thereby wasting both energy and the source materials, creating cleaning problems and, when different source materials are to be used for successive runs, presenting contamination problems between runs. By way of contrast, in a radiant absorption heating system, radiant energy in the form of radio frequency (RF), infra-red (IR) ormicrowave energy is projected from outside the reactor vessel into the reactor vessel where it is selectively absorbed by a susceptor. As the energy is absorbed by the susceptor. the susceptor becomes hotter than the surrounding elements of the reactor vessel and consequently selectively heats up a susceptor-carried substrate for the material to be deposited. While the selective heating of the substrate relative to the other reactor vessel elements is a clear advantage of the radiant absorption heater system, economic operation of such a system clearly requires a susceptor which will efficiently use the energy being introduced. The present invention is directed to a susceptor for use in such a radiant absorption heater system.

Various considerations severely restrict the selection of material for use as a susceptor. Clearly the material must be capable of efficiently absorbing the specific form of radiant energy being introduced into the reaction vessel so as to minimize the energy input required to bring the system to, and maintain it at, its usual operating temperature (this typically being in the neighborhood of 700° C. or higher for the production of epitaxial III-V materials). Obviously the material must also be chemically inert with respect to the materials it contacts, including the source gases being introduced into the reaction vessel, and must not be a source of contamination to either the source gases, the substrate or the material being produced. When heated to the temperatures typically encountered by susceptors (often in excess of 1,000° C.), most materials outgas—that is, they release from within gases which act as a source of contamination for the source gases, the substrates, and the material to be deposited, thereby introducing elements foreign to the desired reaction and resulting in an inferior end-product. Finally, use of the material must be economically feasible in the quantitites required for susceptor use.

In a horizontal type reactor, the susceptor has the configuration of a box of rectangular parallelopiped and the reaction gases are directed from one end, across the full length thereof, towards the other end. The wafers to be grown are disposed on only the large upwardly-facing surface of the susceptor, typically in recesses provided for this purpose. The other large surface (i.e., the downwardly-facing one) does not carry any wafers at all and is used solely for support of the susceptor. As the four sides of the susceptor do not carry any wafers, the "utilized area" for a horizontal reactor is relatively low. For example, a susceptor having a surface area of approximately 3,528 $cm^2$ (547.1 $in.^2$) can be used for 18 wafers of 7.62 cm (three inch) diameter, disposed in three longitudinal rows of six wafers each. The power requirement (defined as the power to bring the susceptor to reaction temperature) is 50 kilowatts, and the utilized area (defined as the surface area occupied by wafers/total susceptor surface area) is about 23%.

Actually, in a horizontal reactor the susceptor is usually tilted slightly upwardly in the direction of the gas flow (i.e., downstream) so that the rear or downstream wafers are exposed to fresh input gas. This minimizes the problem of depletion which occurs when a fair sized series of successive upstream wafers deplete the input gases of the reactive components and expose the most downstream wafers only to the relatively exhausted input gases. The tilting of the susceptor can also assist in maintaining the desired temperature profile within the reactor vessel.

Other reactor types are subject to similar deficiencies. An eight sided infrared heated vertical reactor may have almost double the wafer capacity (say about 30 such wafers), but an even lower utilized area of only about 17%. As much of the surface area of its susceptor is being heated for no functional purpose, the power requirement of this type of reactor is quite high, about 115 kilowatts. Thus, a 67% increase in the wafer capacity requires a 130% increase in the power requirement. In a radio frequency heated pancake-type reactor, a slightly enhanced capacity of 21 such wafers (relative to the horizontal reactor) provides slightly enhanced utilized area of 27%, but the reactor requires 100-115 kilowatts, at least twice as much power. Thus the need remains for a reactor which is characterized by both a large wafer capacity, and a low power requirement, in other words, a high utilized area. Accordingly, it is an object of the present invention to provide a reactor having a high utilized area so as to maximize its wafer capacity and minimize its power requirement.

Another object is to provide a horizontal reactor employing a special susceptor which enables an approximate doubling of the utilized area so as to achieve an approximate doubling of the wafer capacity without an appreciable increase in the power requirement relative to a standard susceptor.

It is also an object of the present invention to provide such a reactor which minimizes or obviates the depletion problem.

SUMMARY OF THE INVENTION

It has now been found that the above and related objects of the present invention are obtained in a reactor for use in a chemical vapor deposition process comprising a reaction vessel having a gas inlet, a gas outlet and a substantially vertical gas flow path therebetween, a substantially solid susceptor configured as a truncated wedge, and heating means disposed about the reaction vessel for heating of the susceptor. The susceptor comprises a body having a top, a bottom, a pair of longitudinally-spaced ends, and a converging pair of opposed faces, each of the faces having means to receive a plurality of wafers and maintain the wafers exposed to the gas flow path. The susceptor is disposed within the reaction vessel with the opposed faces converging in a direction counter to that of the gas flow path.

In a preferred embodiment, the susceptor ends are trapezoidal in configuration, with the susceptor top and bottom generally being parallel and the susceptor ends also beng generally parallel. The susceptor is configured and dimensioned so that over 30%, and preferably 40%, of its surface area may be occupied by wafers. Each of the opposed faces preferably extends further horizontally than vertically (in other words, is longer than it is high). Each of the two susceptor faces preferably has an equal number of the receiving means. More particularly, each has means to receive a vertically-spaced plurality of horizontally extending rows of wafers, each face having three rows of the receiving means, and preferably three rows of six receiving means each.

The heating means comprises a radiant absorption heating system which may be, for example, of the radio frequency or infrared type. The reaction vessel preferably has the gas inlet adjacent to the top thereof and the gas outlet adjacent to the bottom thereof. Means may further be provided for positioning the susceptor in the reaction vessel, the susceptor having a groove in each of its ends into which the positioning means are received.

Compared to a conventional substantially solid susceptor configured as a rectangular parallelopiped for use in a horizontal gas flow and having a given power requirement, the substantially solid susceptor of the present invention, configured as a truncated wedge for use in a vertical gas flow, has a power requirement of less than 1.1 times the given power requirement despite a doubled wafer capacity.

The present invention is also directed to a susceptor for use with wafers in a chemical vapor deposition process in a radiant absorption heater system comprising a substantially solid body configured as a truncated wedge. The body has a top, a bottom, a pair of ends, and an upwardly converging pair of opposed faces, each of the faces having means to receive a plurality of wafers. Preferably each of the faces has a length between the ends greater than the height between the top and bottom.

BRIEF DESCRIPTION OF THE DRAWING

FIG. 4 is a fragmentary side elevation view of the reactor assembly in a closed position;

FIG. 5 is a fragmentary bottom plan view of the reactor assembly;

DETAILED DESCRIPTION OF THE PREFERRED EMBODIMENTS

Figure 1:
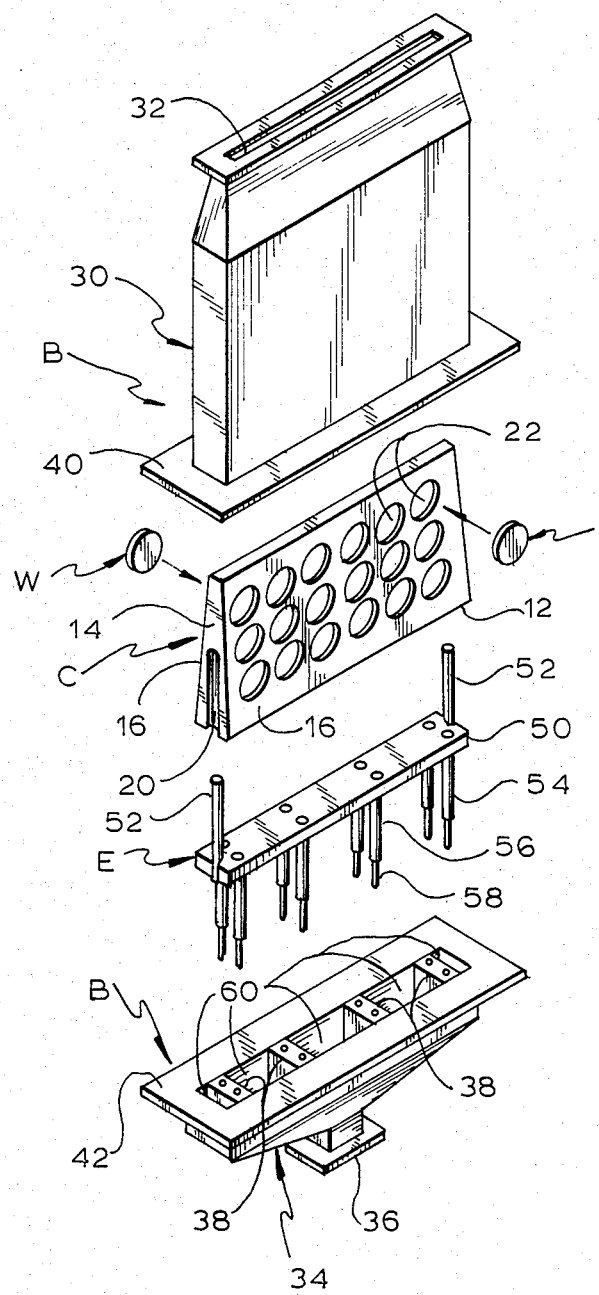
FIG. 1 is an exploded isometric view of the reaction vessel, the susceptor and the holder, with two wafers being shown for illustrative purposes.
Figure 2:
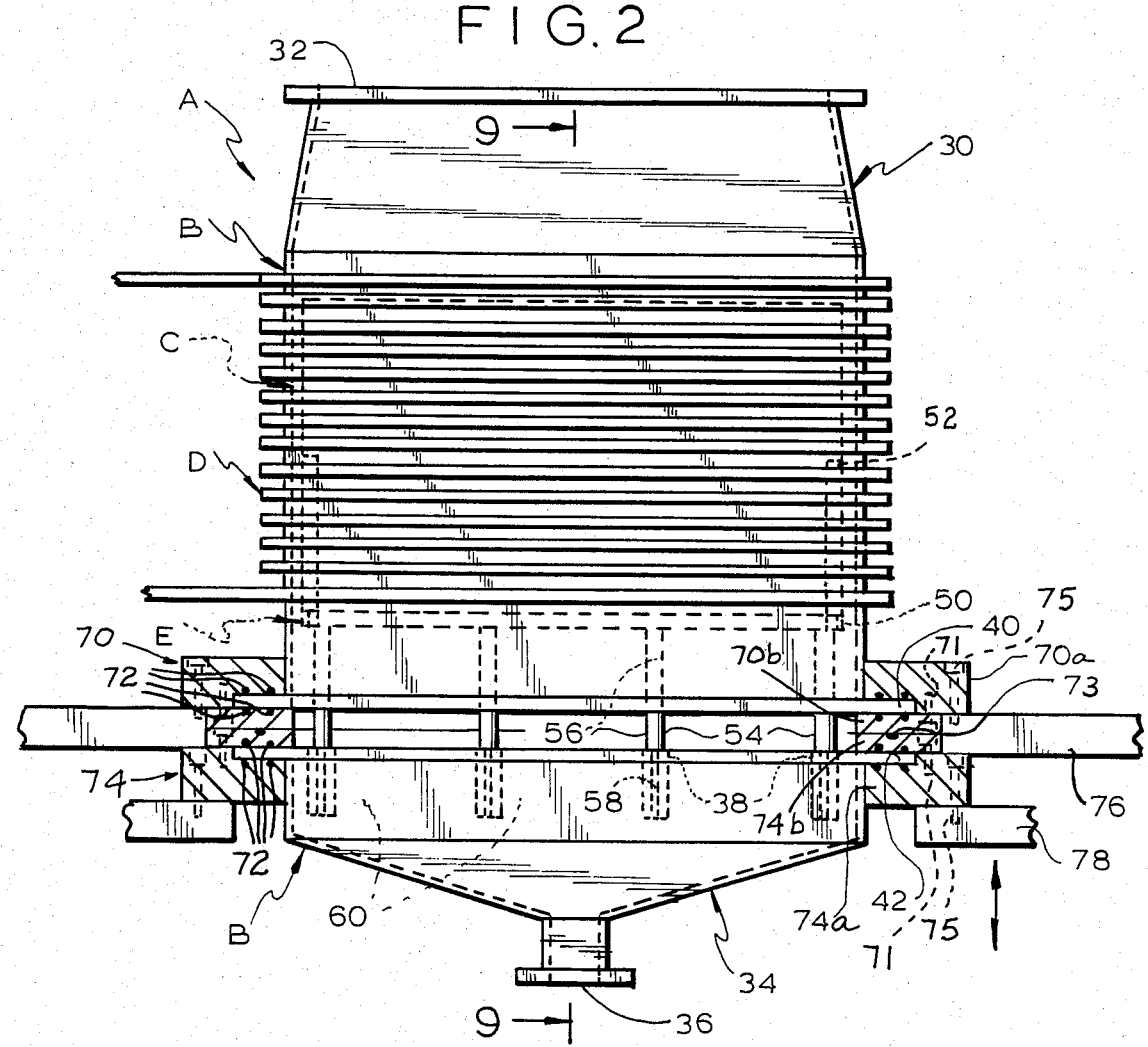
FIG. 2 is a fragmentary front elevation view of the reactor assembly in a closed position.
Figure 3:
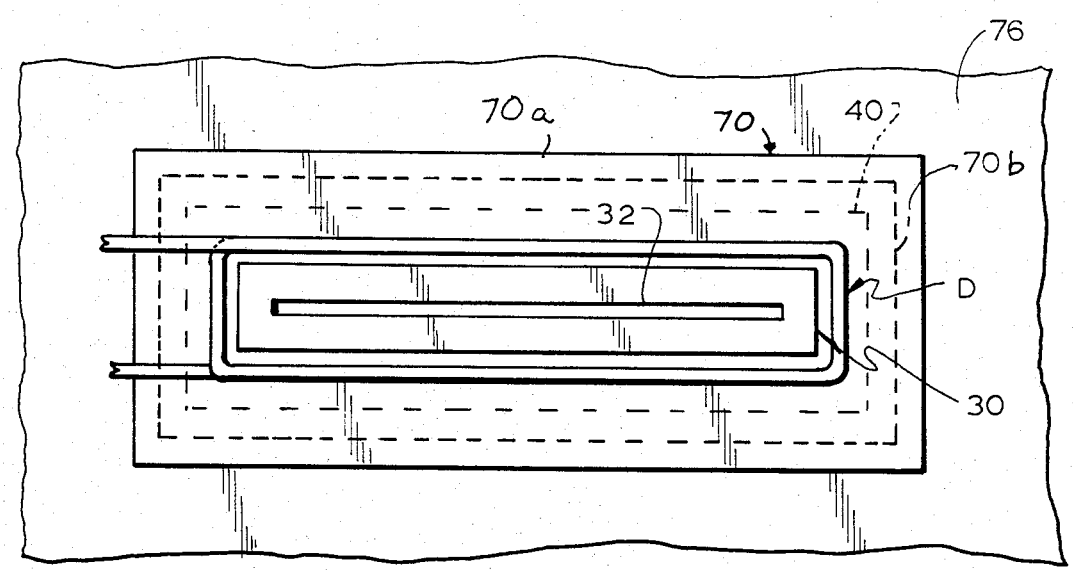
FIG. 3 is a fragmentary top plan view of the reactor assembly.

Referring now to the drawing and in particular to FIGS. 2-9 thereof, therein illustrated is a reactor A according to the present invention. The reactor A comprises a reaction vessel B, a susceptor C disposed within the reaction vessel B, heating means D disposed about the reaction vessel B for heating of the susceptor C, and, optionally, means E for positioning the susceptor C in the reaction vessel B. The reactor A is shown with the reaction vessel B in its closed position in FIGS. 2, 4, 8 and 9, and in its open position in FIGS. 6 and 7.

Referring now in particular to FIG. 1, the susceptor C is configured as a truncated wedge and comprises a body having a top 10, a bottom 12, a pair of longitudinally spaced ends 14, and an upwardly converging pair of opposed faces 16. The susceptor top 10 and bottom 12 are generally parallel and rectangular in configuration while the susceptor ends 14 are generally parallel and trapezoidal in configuration. The opposed faces 16 are rectangular and, like the long edges of the susceptor ends 14, converge in a direction counter to that of the downward gas path to be described hereinafter—in other words, they converge upwardly.

Each susceptor end 14 defines a small peripheral groove 20 extending from the bottom 12 upwardly about halfway towards the top 10, the groove being adapted to be engaged by the means E for positioning the susceptor C within the reaction vessel B.

Each of the susceptor faces 16 has means 22 configured and dimensioned to receive a plurality of polished substrates or wafers W (two such wafers W being represented in FIG. 1) and maintain the wafers W exposed to the aforementioned gas flow path. Each of the two faces 16 preferably has an equal number of receiving means 22, each face being illustrated as having eighteen receiving means 22 adapted to receive a vertically spaced plurality of horizontally extending rows of wafers W. More particularly, each of the faces 16 is provided with three rows of six receiving means each. The number of rows and the number of receiving means on each row will, of course, be a function of the susceptor size, the wafer size and in general the particular application intended. Nonetheless, for reasons which will be apparent hereinafter, it is preferred that each face extend further horizontally than vertically so that there will be relatively few rods, each containing a relatively large number of receiving means 22. While it is not required that each of the faces 16 have an equal number of receiving means 22, this is the desired goal from the standpoint of efficiency and economy.

The wafer-receiving means 22 are preferably recesses in the faces 16. Each recess is preferably slightly oversized relative to the wafer diameter to facilitate insertion of the polished substrate or wafer and removal of the epitaxially grown wafer (actually a polished substrate with an epitaxially grown layer thereon) using tweezers, vacuum pencils or the like. The depth of the recesses is generally equal to or slightly less than that of the wafer so as to expose the outer surface of the wafer to the gas flow path. Alternate means recognized in the art for enabling a susceptor to receive and maintain wafers may be employed. For example, the faces 16 may be substantially planar except for outwardly projecting nipples, arranged so that a plurality of nipples (generally a pair) receive and maintain each wafer in the desired position on the face. The nipples, of course, must be made of a material compatible with that of the susceptor to avoid devitrification, peeling, contamination and the like.

It will be appreciated that the susceptor C is substantially solid, the grooves 20 and recesses 22 in no way affecting this substantial solidity. The susceptor is preferably substantially homogeneous in composition and of uniform density, although variations in composition and density may be employed to alter the natural temperature profile of the susceptor, if desired. The susceptor C may be formed of any of the materials coventionally used for susceptors including high purity quartz, black-coated quartz, graphite, glassy carbon, silicone carbide, molybdenum, etc. Preferably the susceptors are formed of graphite coated with silicon carbide to effect a seal and prevent outgassing.

The illustrated susceptor C preferably has overall dimensions of 21.0 inches by 12.0 inches with a thickness tapering from 1.288 inches at the bottom 12 to 0.50 inches at the top 10. Each groove 20 has a radius of 0.25 inches and a height of 6.0 inches. The receiving means or recesses 22 are spaced at least 1.00 inches from the bottom 12, 1.04 inches from the ends 14, and 1.70 inches from the top 10. The recesses 22 are approximately 3.05–3.06 inches in diameter to accommodate 3inch diameter wafers.

The susceptor C is disposed within the reaction vessel B, the latter comprising an upper section 30 having a gas inlet 32 adjacent the top thereof extending substantially the length of the susceptor top 10 and a lower section 34 having a gas outlet 36 adjacent the bottom thereof. The lower vessel section 34 is provided with four cross-members 38 which provides support for the positioning means E in a manner described hereinafter. The gas inlet 32 and gas outlet 36 are adapted to be connected to a gas supply (not shown) and a gas discharge or recirculation vent (not shown), respectively, so that a substantially vertical gas flow path is established between the upper inlet 32 and lower outlet 36.

The bottom of the upper section 30 defines an outwardly extending peripheral rim or flange 40, and the top of the lower section 34 similarly defines an outwardly extending peripheral rim or flange 42. While the lower flange 40 of the upper section 30 and the upper flange 42 of the lower section 34 may be of similar dimensions and aligned with one another vertically, the opposing faces of the flanges remain vertically spaced even in the closed position of the reaction vessel. The upper portion of the upper section 30 tapers slightly outwardly from the inlet 32 while the lower portion thereof defines an open-bottom chamber configured and dimensioned to enable the susceptor C to be totally received therewithin. The middle portion of the lower section 34 slopes inwardly so that the downward gas flow passing the cross-members 38 is concentrated and channeled into the outlet 36.

Still referring to FIG. 1 in particular, the means E for positioning susceptor C within the reaction vessel B comprises a substantially planar rectangular support bar 50 having a pair of upstanding posts 52, one at either end thereof, and a plurality of depending spacer rods 54. The upstanding posts 52 are configured and dimensioned to be received within the grooves 20 of the susceptor ends 14 while the susceptor bottom 12 is resting on the top of the support bar 50. The engagement of the grooves 20 by the upstanding posts 52 stabilizes the susceptor C to prevent it from tipping over.

The depending spacer rods 54 each have an upper section 56 and a lower section 58 of reduced diameter, the cross-members 38 of the lower reaction vessel section 34 having open-topped cylindrical apertures capable of accommodating the reduced diameter portions 58, but not the normal diameter portions 56. Accordingly, the support bar 50 is spaced by the length of the normal diameter portion 56 above the lower section 34, thereby permitting the gases which have traveled downwardly past the susceptor C and support bar 50 to sweep under the support bar 50 and into the passageways 60 (at least partially defined by the cross-members 38) leading to the gas outlet 36. (Obviously if the susceptor C or support bar 50 rested directly atop the cross-members 38, access of the gas to the passageways 60 would be blocked.)

The reaction vessel B and the positioning means E are both preferably made of clear fused quartz.

Conventional heating means D are disposed about the reaction vessel, particularly the upper section 30 thereof, for heating of the susceptor C disposed within the reaction vessel B. The heating system is of the radiant absorption variety wherein radiant energy in the form of radio frequency (RF), infrared (IR) or microwave energy is projected from outside into the reactor vessel, where it is selectively absorbed by the susceptor C. Preferably radio frequency energy is utilized to heat the susceptor, the susceptor composition having been selected at least partially for its ability to absorb within this frequency.

The reaction vessel B is provided with three sealing means: an upper sealing means 70, an intermediate sealing means 72, and a lower sealing means 74. The upper sealing means 70 covers the upper and side surfaces of the flange 40 at the bottom of the upper reaction vessel section 30 and is fixedly secured thereto. The bottom sealing means 74 covers the bottom and side surfaces of the flange 42 at the top of the lower reaction vessel section 34 and is secured thereto for movement therewith. The intermediate sealing means 72 is configured and dimensioned to cover the top surface of the flange 42 to which it is secured for movement as a unit and the bottom surface of the flange 40 to which it is not secured. The sealing members may be made of stainless steel or other material compatible with the quartz with which it comes into contact and preferably contains gaskets extending towards the opposing faces of the flanges 40, 42, as appropriate, to effect a seal between such flanges and the sealing members.

Because the heating means D is wrapped in coils about the length of the upper reaction vessel section 30 (which is disposed about the susceptor C when the reaction vessel B is in the closed position), the upper section 30, heating means D, and upper sealing member 70 are fixed in position, for example, by being secured to a fixed frame 76, such as the housing for the reactor A. Thus, the heating means D, upper reaction vessel section 30, and upper sealing member 70 form a single stationary sub-assembly whose position is determined by fixed member 76.

Figure 6:
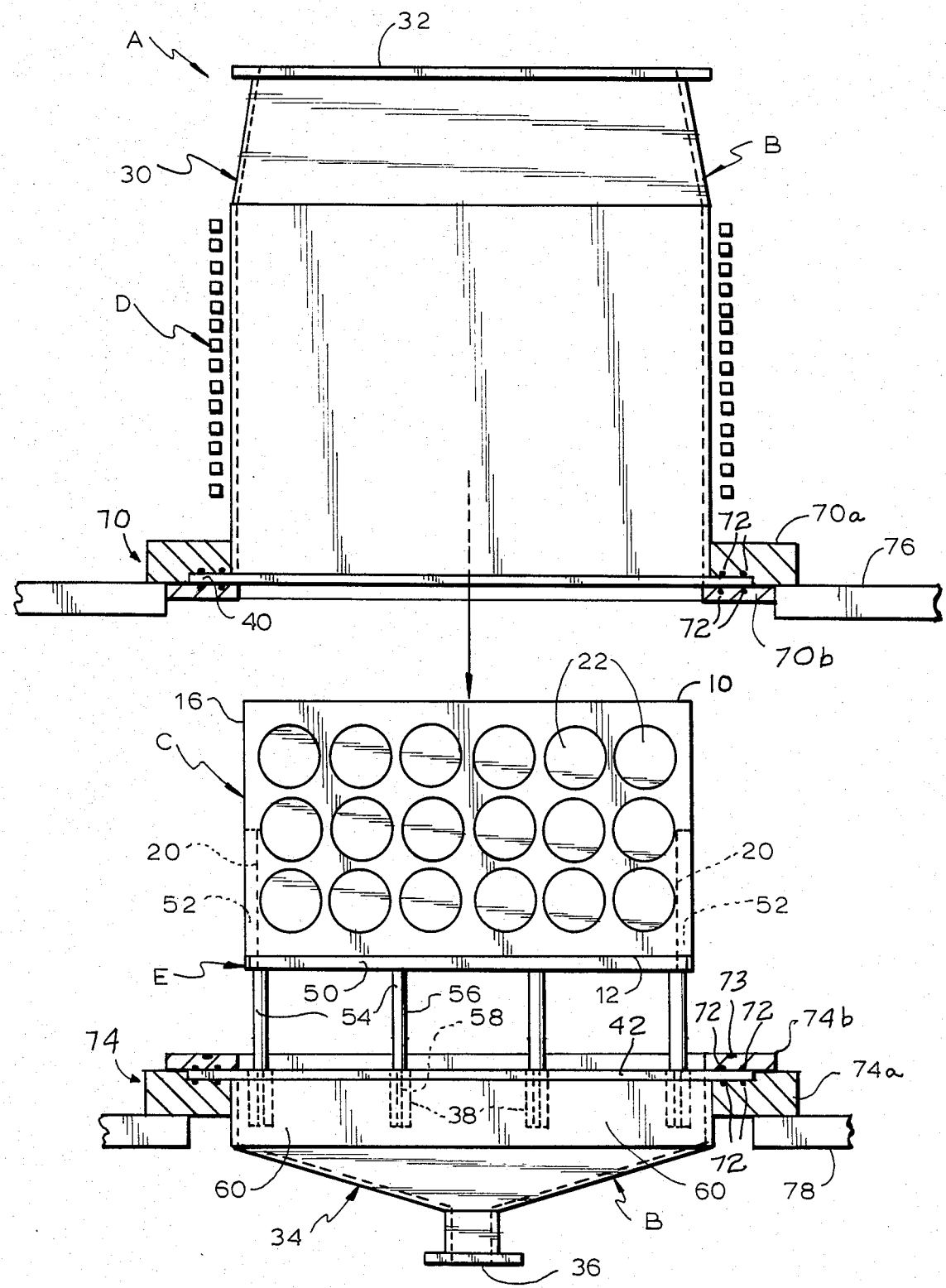
FIG. 6 is a fragmentary front elevation view of the reactor assembly, similar to FIG. 2, but with the assembly in the open position.
Figure 7:
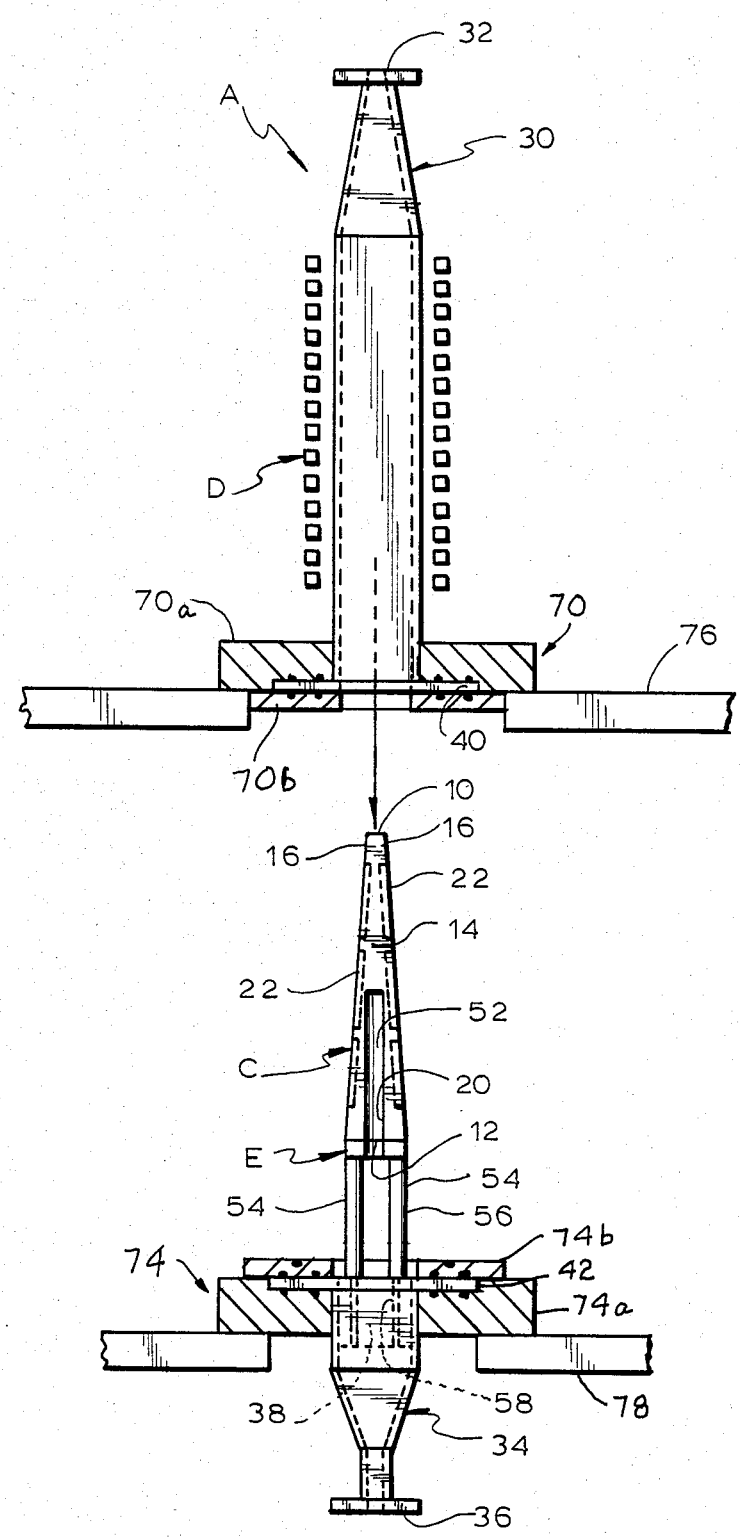
FIG. 7 is a fragmentary side elevation view of the reactor assembly, similar to FIG. 4, but with the assembly in the open position.

By way of contrast, the lower reaction vessel section 34, positioning means E, susceptor C (including any wafers W carried thereby), and the intermediate and lower sealing members 72, 74 are secured to a movable carriage 78 to form a movable sub-assembly capable of being withdrawn from the fixed sub-assembly, by a downward movement in the direction of the arrows of FIGS. 6 and 7, sufficiently to enable performance of all necessary housekeeping tasks including removal and insertion of wafers W, cleaning or replacement of the susceptor C, and even removal of the positioning means E from the lower reaction vessel section 34. The vertical motion of the movable carriage 78 which supports the lower sealing member 74 may be manual or mechanical depending upon the degree of automation desired for the operation.

The fixed frame 76 and movable carriage 78 do not contact the quartz of the reaction vessel B and hence may be formed of ordinary steel plate. The fixed frame 76 may be secured to the upper sealing member 70 and the movable carriage 78 may be secured to the lower sealing member 74 by any of the fastening techniques conventional in the art.

Figure 8:
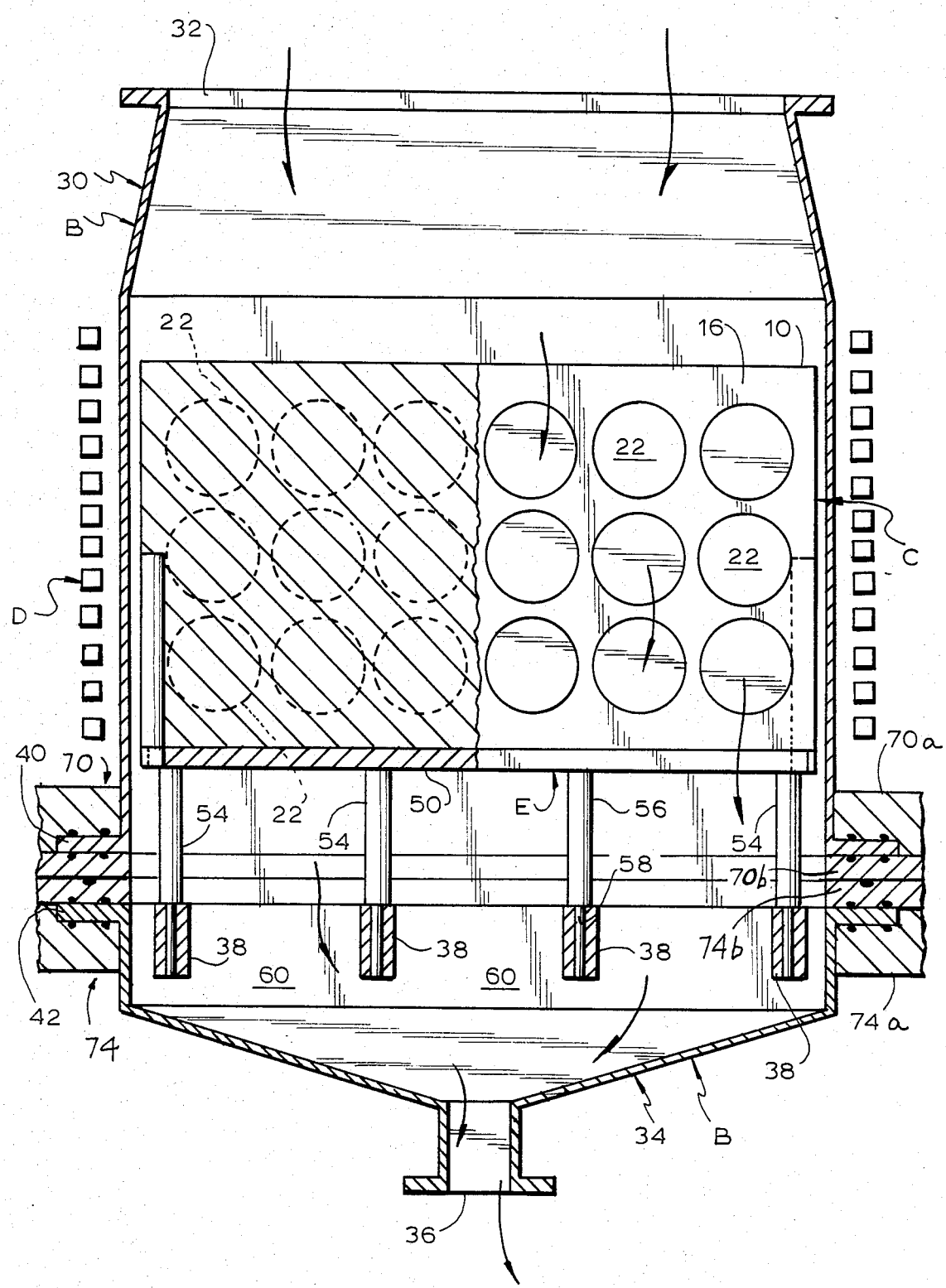
FIG. 8 is a fragmentary sectional view of the reactor assembly taken along the line 8—8 of FIG. 4.
Figure 9:
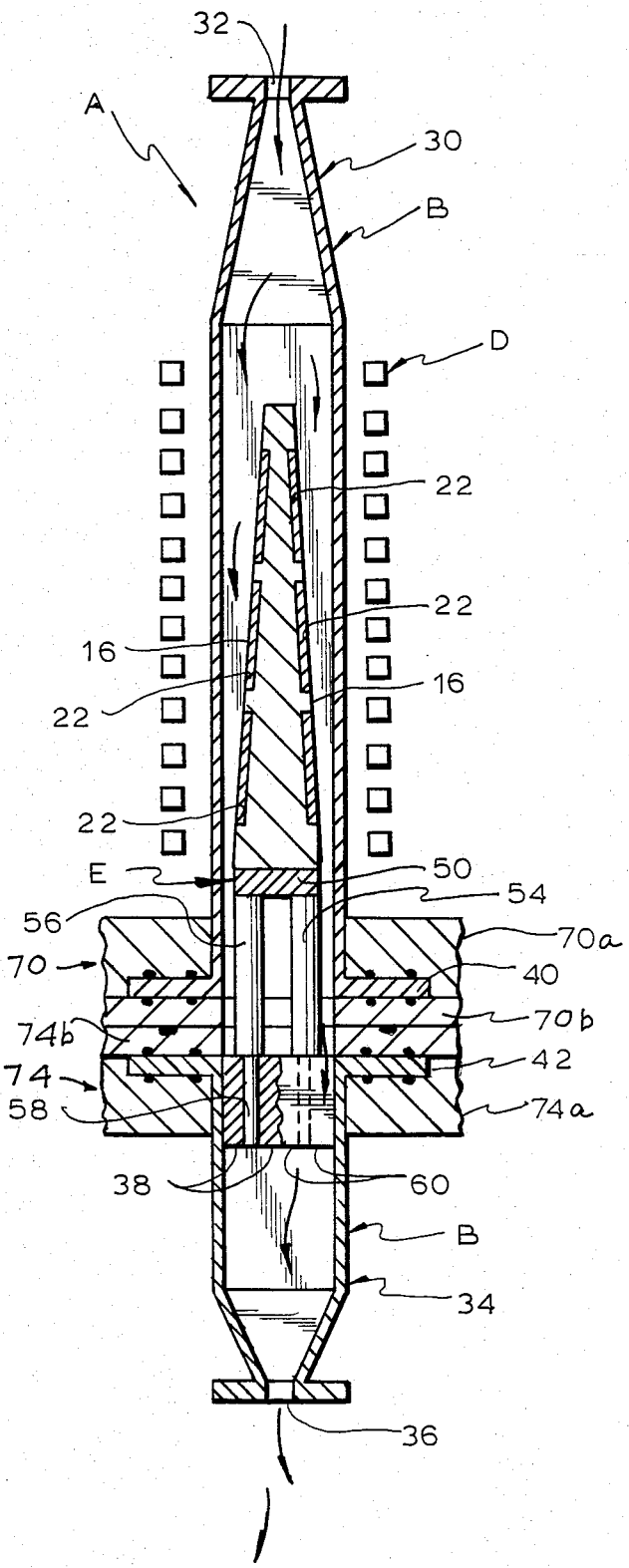
FIG. 9 is a fragmentary sectional view of the reactor assembly taken along the line 9—9 of FIG. 2.

In use, the two sections 30, 34 of the reaction vessel B are in closed position, as illustrated in FIGS. 2, 4 and 8–9. Their respective flanges 40, 42 are separated by the intermediate sealing member 72 which serves to preclude the escape of gases from the reaction vessel. Source gases appropriate for the particular CVD reaction contemplated are introduced along the full length of the gas inlet 32 in the upper reaction vessel section 30. The gas is passed downwardly, being split into two streams by the wedge-shaped susceptor C. Because the lower wafers extend further outwardly from the midplane of the susceptor C than the upper wafers, and because there are only three rows of wafers in all, the lower wafers are exposed to relatively fresh input gases, thereby minimizing or completely avoiding the common depletion problem. The unused portions of the two gas streams recombine below the crossbar 50 and eventually enter the passageways 60 of the lower reaction vessel section 34 on their way to the gas outlet 36. The gas flow path is indicated by the arrows of FIGS. 8 and 9.

To remove the epitaxially grown wafers from the susceptors, the movable carriage 78 is transported in the direction of the arrows of FIGS. 6–7, thereby displacing downwardly the entire movable sub-assembly (comprising the susceptor C, positioning means E, lower reaction vessel section 34 and the intermediate and lower sealing members 72, 74) and so "opening" the reactor. After replacement of the grown wafers with the new polished wafers, the movable carriage 78 is raised into the position indicated in FIGS. 2, 4 and 8–9, thereby displacing upwardly the entire movable sub-assembly to the illustrated position and so "closing" the reactor.

The "utilized area" of a susceptor, defined as the percentage of the susceptor surface area occupied by wafers (or potentially occupied by wafers when it is fully loaded), is a measure of its efficiency. The illustrated susceptor C of the present invention can accommodate 36 wafers, each having a 7.62 centimeter (3.0 inch) diameter. The surface area of the susceptor, excluding the grooves 20 and recesses 22 (assuming faces 16 to be planar), is 3,604 centimeters square (558.8 inches square) so that the utilized area is 45%. By way of comparison, in a conventional horizontal reactor using a susceptor of approximately the same dimensions (3,528 cm$^2$) the wafer capacity is only half (18 wafers) so that the utilized area is only 23%. A pancake type reactor with a susceptor of roughly similar dimensions (3508 cm$^2$) may have a slightly greater wafer capacity (21 wafers) than the horizontal reactor, and a roughly comparable utilized area of 27%. A vertical type reactor utilizes a susceptor of high surface area (since the susceptor is generally a hollow polygon) and may accommodate only 30 wafers on a surface area 8225 cm$^2$ to give a very low utilized area of 17%.

It has already been noted that the wedge shaped susceptor of the present invention has twice the wafer capacity of a rectangular parallelopiped or box-shaped susceptor having dimensions equal to the average corresponding dimensions of the susceptor of the present invention. (This follows logically from the fact that both faces of the susceptor of the present invention may be utilized for bearing wafers, rather than just one face.) Because the overwhelmingly largest portion of the energy requirement of a reactor vessel is the energy required to bring the susceptor up to temperature, with only a minute fraction of the energy actually being utilized to bring the wafers themselves up to temperature, the power requirement of the illustrated susceptor C of the present invention (51 kilowatts) is, despite its doubling of the wafer capacity, less than 1.1 times the power requirement of the aforementioned box-shaped susceptor (50 KW) having dimensions equal to the average corresponding dimensions of the susceptor of the present invention. (In other words, the conventional susceptor for use in a horizontal gas flow has a power requirement which is at least 90% that of the susceptor of the present invention, despite its having a wafer capacity which is only 50%.) The power requirements of the previously referenced pancake and vertical reactors are substantially higher, about 115 KW for the vertical reactor and 100–115 KW for the pancake reactor.

More precisely, the 51 KW power requirement of the susceptor of the present invention is only 1.02 times the 50 KW power requirement of the aforementioned box-shaped susceptor, despite a doubling of the wafer capacity (in other words, the conventional box-shaped susceptor with half the wafer capacity has a power requirement which is 98% that of the susceptor of the present invention). Both the reactor of the present invention and the reactor of the conventional box-shaped susceptor have the same power ratio of 14.17 watts per cm$^2$ ("power ratio" being defined as the power requirement divided by the susceptor area).

It will be appreciated that the problem of depletion is avoided or mitigated by two separate factors in the present invention. First, the opposed susceptor faces converge in a direction counter to that of the gas flow so that at least some fresh input gas is directed to even the downstream wafers. Second, because the input gas flow is broadside to the long dimension of the susceptor, the gas stream longitudinally passes only a few wafers (e.g., two) rather than a great number (e.g., five) during its flow path from the first wafer until it reaches the last wafer.

Now that the preferred embodiments of the present invention have been shown and described in detail, various modifications and improvements thereon will become readily apparent to those skilled in the art. Accordingly, this spirit and scope of the present invention is to be limited only by the appended claims, and not by the foregoing specification.

We claim:

1. A reactor for use in a chemical vapor deposition process comprising:
   (a) a reaction vessel having a gas inlet, a gas outlet and a substantially vertical gas flow path therebetween;
   (b) a substantially solid susceptor configured as a truncated wedge, said susceptor comprising a body having a top, a bottom, a pair of longitudinally spaced ends, and a converging pair of opposed faces; each of said faces having means to receive a plurality of wafers and maintain the wafers exposed to said gas flow path, said susceptor being disposed within said reaction vessel with said opposed faces converging in a direction counter to that of said gas flow path; and
   (c) heating means disposed about said reaction vessel for heating said susceptor.

2. The reactor of claim 1 wherein said reaction vessel has said gas inlet adjacent the top thereof and said gas outlet adjacent the bottom thereof.

3. The reactor of claim 1 wherein said susceptor ends are trapezoidal in configuration.

4. The reactor of claim 1 wherein said susceptor top and bottom are generally parallel, and said susceptor ends are generally parallel.

5. The reactor of claim 1 wherein said susceptor is configured and dimensioned so that over 30% of its surface area may be occupied by wafers.

6. The reactor of claim 5 wherein said susceptor is configured and dimensioned so that over 40% of its surface area may be occupied by wafers.

7. The reactor of claim 1 wherein each of said faces extends further horizontally than vertically.

8. The reactor of claim 1 wherein each of said faces has an equal number of said receiving means.

9. The reactor of claim 8 wherein each of said faces has means to receive a vertically spaced plurality of horizontally extending rows of wafers.

10. The reactor of claim 9 wherein each of said faces has three rows of said receiving means.

11. The reactor of claim 10 wherein each of said faces has three rows of six receiving means each.

12. The reactor of claim 1 additionally comprising means for positioning said susceptor in said reaction vessel, said susceptor having a groove in each of its ends into which said positioning means is received.

13. The reactor of claim 1 wherein said heating means comprises a radiant absorption heating system.

14. The reactor of claim 1 wherein said substantially solid susceptor configured as a truncated wedge for use in a vertical gas flow is characterized by a power requirement of less than 1.1 P, where P is the power requirement of a substantially solid susceptor configured as a rectangular parallelopiped for use in a horizontal gas flow, the rectangular parallelopiped susceptor having dimensions equal to the average corresponding dimensions of said truncated wedge susceptor.

15. The reactor of claim 1 wherein said substantially solid susceptor configured as a truncated wedge for use in a vertical gas flow is characterized by a capacity of N wafers of given size and a power requirement of P as compared with a substantially solid susceptor configured as a rectangular parallelopiped for use in a horizontal gas flow, the rectangular parallelopiped susceptor having dimensions equal to the average corresponding dimensions of said truncated wedge susceptor and being characterized by a capacity of 0.5N wafers of said given size and a power requirement of at least 0.9 P.

* * * * *